(12) United States Patent
Stephens et al.

(10) Patent No.: US 9,431,380 B2
(45) Date of Patent: Aug. 30, 2016

(54) MICROELECTRONIC ASSEMBLY HAVING A HEAT SPREADER FOR A PLURALITY OF DIE

(71) Applicant: Freescale Semiconductor, Inc., Austin, TX (US)

(72) Inventors: Tab A. Stephens, Austin, TX (US); Michael B. McShane, Austin, TX (US); Perry H. Pelley, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/678,352

(22) Filed: Apr. 3, 2015

(65) Prior Publication Data

US 2015/0214208 A1    Jul. 30, 2015

Related U.S. Application Data

(62) Division of application No. 13/741,743, filed on Jan. 15, 2013, now Pat. No. 9,070,653.

(51) Int. Cl.
*H01L 23/34* (2006.01)
*H01L 25/00* (2006.01)
(Continued)

(52) U.S. Cl.
CPC ........... *H01L 25/50* (2013.01); *H01L 21/3212* (2013.01); *H01L 21/32133* (2013.01); *H01L 21/76898* (2013.01); *H01L 23/3178* (2013.01); *H01L 23/34* (2013.01); *H01L 23/367* (2013.01); *H01L 23/3677* (2013.01); *H01L 23/481* (2013.01); *H01L 24/05* (2013.01); *H01L 24/81* (2013.01); *H01L 24/92* (2013.01); *H01L 25/04* (2013.01); *H01L 25/0657* (2013.01); *H01L 24/11* (2013.01); *H01L 24/13* (2013.01); *H01L 24/16* (2013.01); *H01L 24/29* (2013.01); *H01L 24/32* (2013.01); *H01L 2224/0225* (2013.01); *H01L 2224/0226* (2013.01); *H01L 2224/0401* (2013.01); *H01L 2224/10122* (2013.01); *H01L 2224/11334* (2013.01);
(Continued)

(58) Field of Classification Search
None
See application file for complete search history.

(56) References Cited

U.S. PATENT DOCUMENTS

| 5,220,195 A | 6/1993 | McShane et al. |
| 5,239,198 A | 8/1993 | Lin et al. |

(Continued)

OTHER PUBLICATIONS

Dewan-Sandur et al., "Thermal Management of Die Stacking Architecture That Includes Memory and Logic Processor", Electronic Components and Technology Conference, 2006, pp. 1963-1968, IEEE, US.

(Continued)

*Primary Examiner* — Benjamin Sandvik
*Assistant Examiner* — Herve Assouman

(57) ABSTRACT

A method of manufacturing a microelectronic assembly (100) and a microelectronic device (4100) that include a stacked structure (101). The stacked structure includes a heat spreader (104), at least one die (106) thermally coupled to at least a portion of one side of the heat spreader, at least one other die (108) thermal coupled to at least a portion of an opposite side of the heat spreader, at least one opening (401) in the heat spreader located in a region of between the two die, an insulator (603) disposed in the at least one opening, and electrically conductive material (1308, 1406) in an insulated hole (705) in the insulator. The heat spreader allows electrical communication between the two die through the opening while the insulator isolates the electrically conductive material and the heat spreader from each other.

17 Claims, 11 Drawing Sheets

(51) Int. Cl.
  *H01L 25/04* (2014.01)
  *H01L 23/00* (2006.01)
  *H01L 25/065* (2006.01)
  *H01L 23/367* (2006.01)
  *H01L 23/48* (2006.01)
  *H01L 23/31* (2006.01)
  *H01L 21/321* (2006.01)
  *H01L 21/3213* (2006.01)
  *H01L 21/768* (2006.01)

(52) U.S. Cl.
  CPC *H01L 2224/131* (2013.01); *H01L 2224/1319* (2013.01); *H01L 2224/13023* (2013.01); *H01L 2224/13025* (2013.01); *H01L 2224/16113* (2013.01); *H01L 2224/16145* (2013.01); *H01L 2224/16146* (2013.01); *H01L 2224/16245* (2013.01); *H01L 2224/2919* (2013.01); *H01L 2224/32245* (2013.01); *H01L 2224/81801* (2013.01); *H01L 2224/81815* (2013.01); *H01L 2224/9202* (2013.01); *H01L 2225/06513* (2013.01); *H01L 2225/06517* (2013.01); *H01L 2225/06541* (2013.01); *H01L 2225/06555* (2013.01); *H01L 2225/06589* (2013.01); *H01L 2924/01029* (2013.01); *H01L 2924/05042* (2013.01); *H01L 2924/05442* (2013.01); *H01L 2924/06* (2013.01); *H01L 2924/10253* (2013.01); *H01L 2924/12042* (2013.01); *H01L 2924/14* (2013.01)

(56) References Cited

U.S. PATENT DOCUMENTS

| | | | |
|---|---|---|---|
| 5,247,423 | A | 9/1993 | Lin et al. |
| 5,467,253 | A | 11/1995 | Heckman et al. |
| 6,472,741 | B1 | 10/2002 | Chen et al. |
| 6,838,776 | B2 | 1/2005 | Leal et al. |
| 7,611,923 | B2 | 11/2009 | Fasano et al. |
| 8,004,080 | B2 | 8/2011 | McShane et al. |
| 8,048,794 | B2 | 11/2011 | Knickerbocker |
| 8,058,736 | B2 | 11/2011 | Koike et al. |
| 2004/0195667 | A1 | 10/2004 | Kamezos |
| 2005/0230802 | A1 | 10/2005 | Vindasius et al. |
| 2006/0148250 | A1* | 7/2006 | Kirby ............ H01L 21/76898 438/667 |
| 2006/0223301 | A1* | 10/2006 | Vanhaelemeersch . H01L 21/762 438/618 |
| 2007/0075413 | A1* | 4/2007 | Egawa ............ H01L 21/6835 257/686 |
| 2007/0278660 | A1 | 12/2007 | Han et al. |
| 2008/0029860 | A1 | 2/2008 | Gao |
| 2008/0136016 | A1 | 6/2008 | Hess et al. |
| 2008/0237844 | A1 | 10/2008 | Aleksov et al. |
| 2009/0045487 | A1* | 2/2009 | Jung ............ H01L 21/76898 257/621 |
| 2010/0065953 | A1 | 3/2010 | Egawa |
| 2010/0148357 | A1 | 6/2010 | Yang et al. |
| 2011/0012257 | A1 | 1/2011 | Eu et al. |
| 2011/0057306 | A1 | 3/2011 | McShane et al. |
| 2011/0085304 | A1 | 4/2011 | Bindrup et al. |
| 2011/0156233 | A1 | 6/2011 | Kim |
| 2012/0007229 | A1 | 1/2012 | Bartley et al. |
| 2014/0071652 | A1 | 3/2014 | McShane et al. |
| 2014/0151891 | A1 | 6/2014 | Takano et al. |
| 2014/0182895 | A1 | 7/2014 | Lee et al. |

OTHER PUBLICATIONS

Edwards, Darvin, "Thermal Management for Low Cost Consumer Products", Texas Instruments, US.
Krishnamoorthi et al., "Thermal Performance Evaluation and Methodology for Pyramid Stack Die Packages", 2008, pp. 325-332, IEEE, US.
Kumar et al., "Ultra-High I/O Density Glass/Silicon Interposers for High Bandwidth Smart Mobile Applications", Electronic Components and Technology Conference, 2011, pp. 217-223, IEEE, US.
McShane et al., "Techniques for Reducing Inductance in Through-Die Vias of an Electronic Assembly", Freescale Semiconductor, Inc., U.S. Appl. No. 13/611,076, filed Sep. 12, 2012.
Moon et al., "Thermal Management of a Stacked-Die Package in a Handheld Electronic Device Using Passive Solutions", IEEE Transactions on Components and Packaging Technologies, vol. 31, No. 1, Mar. 2008, pp. 204-210, IEEE, US.
Pelley et al., "Stacked Semiconductor Devices", Freescale Semiconductor, Inc., U.S. Appl. No. 13/268,580, filed Oct. 7, 2011.
Pelley et al., "Stacked Semiconductor Devices", Freescale Semiconductor, Inc., U.S. Appl. No. 13/268,681, filed Oct. 7, 2011.
La Spina, et al., "PVD Aluminium Nitride as Heat Spreader in Silicon-on-Glass Technology", Proc. 25th International Conference on Microelectronics, May 14-17, 2006, ISBN 1-4244-0117-8/06, IEEE, US.
Chomerics, "T-Wing and C-Wing Heat Spreaders", Technical Bulletin No. 71, pp. 1-6, Oct. 1999, Parker Hannifin Corporation, US.

* cited by examiner

MICROELECTRONIC ASSEMBLY HAVING A HEAT SPREADER FOR A PLURALITY OF DIE

CROSS REFERENCE TO RELATED APPLICATION

This is a divisional of application Ser. No. 13/741,743, filed Jan. 15, 2013, the entire disclosure of which is hereby incorporated by reference herein.

BACKGROUND

1. Field

This invention relates generally to semiconductor devices, and more specifically to heat spreaders in semiconductor device assemblies.

2. Related Art

To improve space efficiency, some semiconductor, or microelectronic, packages include one or more stacks of two or more integrated circuit die, to allow more circuitry to be packaged within a smaller area. However, a stack of die decreases an amount of area that is available for heat dissipation from each die.

A layout of most integrated circuits is optimized for circuit efficiency, and the layout may result in localized areas of a die that generate higher temperatures than other areas of the die. A heat spreader distributes heat from warmer area(s) of a die to cooler area(s) of the die, and may also accomplish heat dissipation from the die. To facilitate distribution and dissipation of heat, a heat spreader typically has high thermal conductivity. Many known heat spreaders also have high electrical conductivity.

A heat spreader may be placed between, and in thermal contact with, two or more die. This allows a single heat spreader to distribute heat from warmer area(s) to cooler area(s) of the two or more die. A heat spreader may be thermally coupled to a heat sink that is located outside a microelectronic device. The heat sink, in combination with the heat spreader, facilitates dissipation of heat from inside the microelectronic package to outside the microelectronic package.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In some known microelectronic devices, electrical power and signals are transferred between dies on opposite sides of a heat spreader by using conductors that go around the heat spreader. Unlike some known microelectronic devices, a heat spreader in accordance with embodiments of the invention allows electrical power and signals to be transferred between dies on opposite sides of the heat spreader by allowing such signals to go through one or more openings in the heat spreader.

A heat spreader in accordance with embodiments of the invention has an electrically insulated through hole within at least one opening in the heat spreader. In one embodiment, the electrically insulated through hole is in a shape of a cylinder extending from one major surface of the heat spreader to an opposite major surface of the heat spreader. Electrically conductive material in the electrically insulated through hole allows for passage of a signal between dies on opposite sides of the heat spreader while advantageously preventing such signal from shorting to the heat spreader.

Figure 1:
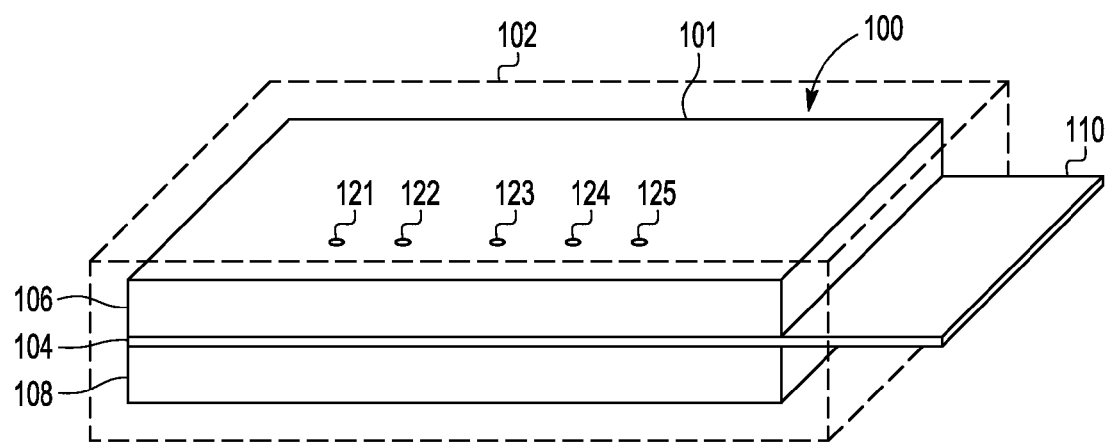
FIG. 1 is a perspective view of a microelectronic assembly including a stacked structure including a heat spreader sandwiched between two die, in accordance with one embodiment of the invention, and an outline of a microelectronic package.

FIG. 1 is a perspective view of a microelectronic assembly 100 in accordance with one embodiment of the invention, and a simplified portion of a microelectronic package 103. The microelectronic assembly 100 includes a stacked structure 101 that may, in one embodiment, be surrounded by an encapsulant. The microelectronic assembly 100 may be implemented with an encapsulant or may be implemented without an encapsulant. In FIG. 1, the dashed lines 102 represent an outline of a microelectronic package 103 that may be included in one embodiment. Several elements and structures of a typical microelectronic package 103 have been omitted from FIG. 1 for simplicity of illustration and because such elements and structures are not needed to understand the claimed invention. Some examples of such omitted elements and structures are external connections, pads, bumps, solder balls and wires. In one embodiment (see FIG. 1), the stacked structure 101 includes a heat spreader 104 sandwiched between a first die 106 and a second die 108. In another embodiment (see FIG. 41), the stacked structure 101 includes a heat spreader 104 sandwiched between a stack of two or more die. The first die 106 is thermally coupled to a first major surface 501 (see FIG. 5) of the heat spreader 104. The second die 108 is thermally coupled to a second major surface 502 (see FIG. 5) of the heat spreader 104. There may also be an adhesive (not shown) between the heat spreader 104 and each die 106, 108. The phrase "thermally coupled" includes, but is not limited to, being in direct contact. In the embodiment shown in FIG. 1, a portion 110 of the heat spreader 104 is not sandwiched between the two die 106, 108. Such portion 110 may extend outside of the microelectronic package 100 and may be thermally connected to a heat sink (not shown). The first die 106 is shown with five (5) through vias, or, if the die is silicon, through silicon vias (TSVs) 121-125. An actual die may have more than one hundred TSVs. For simplicity of illustration, the five (5) TSVs 121-125 are shown in arranged along a line. In an actual die, the TSVs may not be arranged along a line. The discussion that follows assumes an embodiment of the stacked structure 101 in which the second die 108 has a TSV that is approximately aligned with each of the five (5) TSVs 121-125 of the first die 106, as shown in the drawings. In another embodiment (not shown), only a portion of each such TSV of the second die 108 is aligned with only a portion of each of the five (5) TSVs 121-125 of the first die 106.

Figure 2:
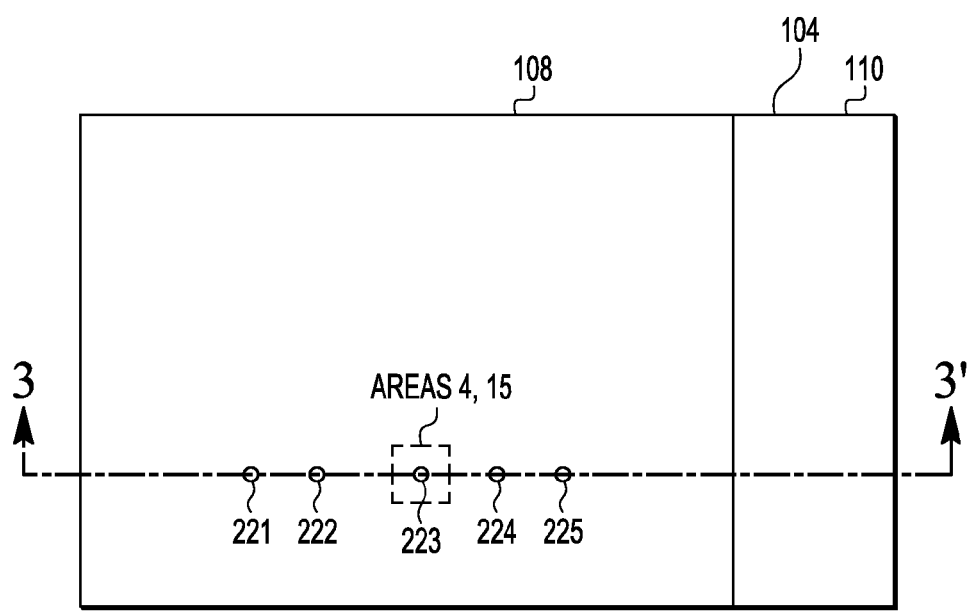
FIG. 2 is a bottom plan view of the heat spreader and the two die of FIG. 1, showing a cut line 3-3' and areas 4, 15 surrounding one through silicon via of the bottom die.
Figure 4:
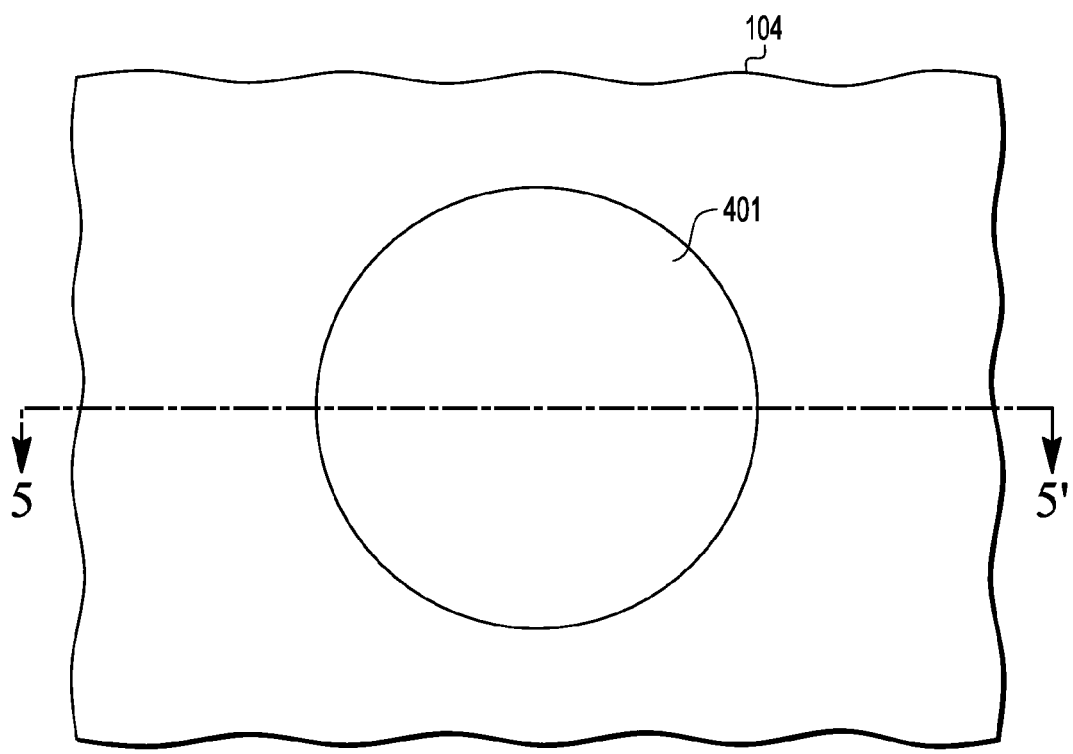
FIG. 4 is a top plan view of area 4 of the heat spreader including an opening in the heat spreader, and showing a cut line 5-5'.
Figure 15:
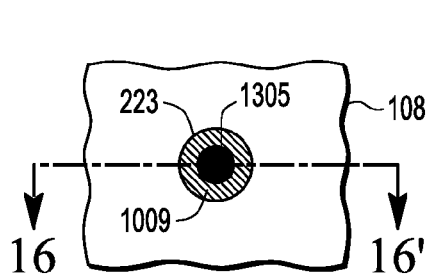
FIG. 15 is a top plan view of area 15 of the bottom die prior to formation of a heat spreader, showing a cut line 16-16'.

FIG. 2 is a bottom plan view of the one embodiment of the stacked structure 101 showing the second die 108 and the portion 110 of the heat spreader 104, and showing a cut line 3-3'. The second die includes TSVs 221-225. In one embodiment, as illustrated, when assembled into the stacked structure 101, TSVs 121-125 of the first die 106 are collinear with TSVs 221-225 of the second die 108. In another embodiment (not shown), when assembled into the stacked structure 101, TSVs 121-125 of the first die 106 are at least partially aligned with TSVs 221-225 of the second die 108. Areas 4, 15 encompass a portion of the heat spreader 104 near the TSV 223 and a portion of the second die 108 near the TSV 223, respectively. A more detailed view of area 4 of the heat spreader 104 is shown in FIG. 4. A more detailed view of area 15 of the second die 108 is shown in FIG. 15.

Figure 3:
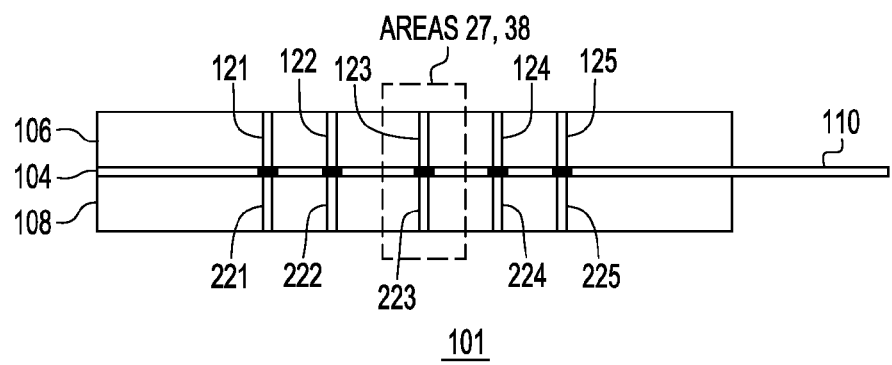
FIG. 3 is a cut view of the heat spreader and the two die of FIG. 2, along cut line 3-3', and showing areas 27, 38.

FIG. 3 is a cut view of the one embodiment of the stacked structure 101 along cut line 3-3'. Typically, the die 106, 108 has a thickness of about 100 µm after polishing. In one embodiment, the TSV has an aspect ratio of 10:1 or less. Therefore, a 100 µm long TSV typically has a diameter of at least 10 µm. Areas 27, 38 encompass a portion of the stacked structure 101. Different embodiments of this portion of the stacked structure 101 are shown in more detail in FIGS. 27 and 38.

The heat spreader includes a thermally conductive material. In one embodiment, the heat spreader is aluminum nitride. In one embodiment, the heat spreader 104 is metallic because metal has a very high thermal conductivity. Examples of such metal include gold, silver, copper and aluminum. Although metal has very high thermal conductivity, it also has high electrical conductivity. Thus, the electrical power and signals that are passed through the heat spreader 104 are electrically isolated from the heat spreader. Failure to electrically isolate the heat spreader 104 from such electrical power and signals may result in shorted circuits or other device failures.

Method of Making at Least One Insulated Hole in a Heat Spreader when the Heat Spreader is in a Form of a Piece Part In one embodiment, the heat spreader 104 may be formed from a self-supporting sheet, foil or plate of metal or another heat conductive material. In such an embodiment, the heat spreader 104 may be considered a "piece part". FIG. 4 is a top plan view of area 4 (see FIG. 2) of the heat spreader 104, and showing a cut line 5-5'. In one embodiment, the heat spreader 104, and the portion thereof, illustrated in FIGS. 1-14 is in a form of a piece part. FIG. 4 illustrates the heat spreader 104 after formation of an opening 401 in the heat spreader. The opening 401 in the heat spreader 104 will be at least approximately aligned with TSV 223 of the second die 108 after assembly of the stacked structure 101. When the heat spreader 104 is in a form of a piece part, the opening 401 may be made by one of lithographic patterning and dry etching, wet etching, drilling, punching, milling, laser or by other conventional methods. The opening 401 in the heat spreader 104 can be of any shape. The opening 401 appears circular in the top view of FIG. 4.

Figure 5:
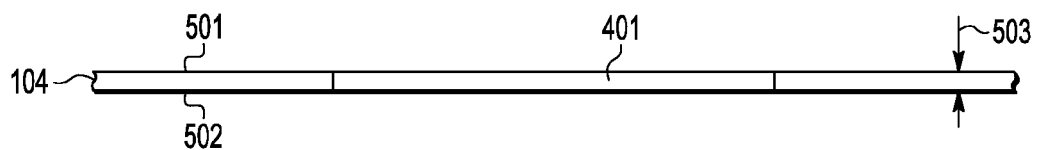
FIG. 5 is a cut view of the portion of the heat spreader of FIG. 4 along cut line 5-5'.

FIG. 5 is a view of the heat spreader 104 along cut line 5-5' of FIG. 4. As illustrated in FIG. 5, in one embodiment, the opening 401 can be considered to have a cylindrical shape with a circular cross-section. Typically, heat spreader 104 has a thickness 503 in the range of about 50 µm to 200 µm, when it is in the form of a piece part.

Figure 6:
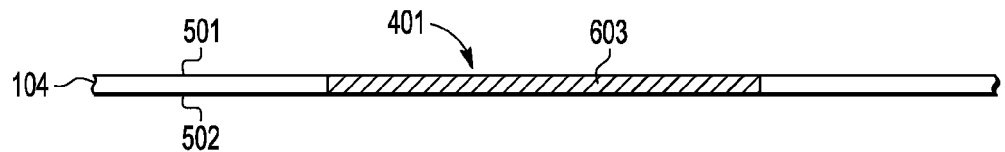
FIG. 6 is a cut view of the portion of the heat spreader of FIG. 4 along cut line 5-5' subsequent to deposition of an electrical insulating material in the opening.

An electrically insulating material (hereinafter "insulator") 603 is disposed in the opening 401 of the heat spreader 104. FIG. 6 is a cut view of the heat spreader 104 along cut line 5-5' of FIG. 4, subsequent to deposition of the insulator 603 in the opening 401 of the heat spreader.

Figure 7:
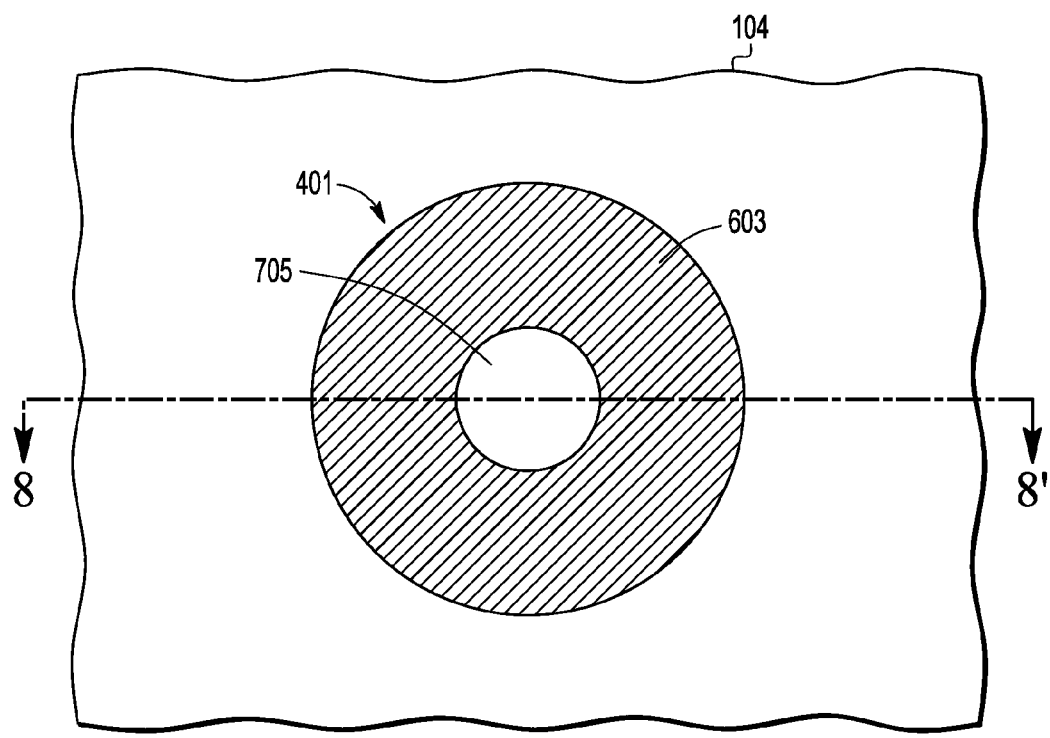
FIG. 7 is a top plan view of the portion of the heat spreader of FIG. 4 including the opening in the heat spreader, the electrical insulating material in the opening, and an insulated hole in the electrical insulating material, and showing a cut line 8-8'.

In accordance with various embodiments of the invention, there is an electrically insulated through hole (hereinafter "insulated hole") 705 in the insulator 603. FIG. 7 is a top plan view of the heat spreader 104 subsequent to formation of the insulated hole 705 in the insulator 603 in the opening 401 of the heat spreader. When the heat spreader 104 is a piece part, the insulated hole 705 in the insulator 603 is created by performing one or more of the following actions: lithographic patterning and dry etching, wet etching, stamping, drilling, punching, or by other conventional methods. The insulated hole 705 in the insulator 603 can be of any shape. In one embodiment, the insulated hole 705 has a circular shape, and, to the extent that the insulator has a significant thickness, the insulated hole can be considered to have a cylindrical shape with a circular cross-section. Typically, a diameter of the insulated hole 705 is approximately equal to a diameter of a TSV. The insulator 603 electrically isolates the heat spreader 104 from any electrical conductive material that may be in the insulated hole 705. In one embodiment, the insulator 603 is a dielectric. The insulator 603 can be silicon dioxide, silicon nitride, tetraethyl orthosilicate (TEOS) or a non-electrically conductive polymer. Any portion of the insulator 603 that extends beyond the major surfaces 501, 502 of the heat spreader 104 is removed by polishing or etch back or by other conventional means, thus allowing better thermal conductivity between the two die 106, 108 and the heat spreader.

Figure 8:
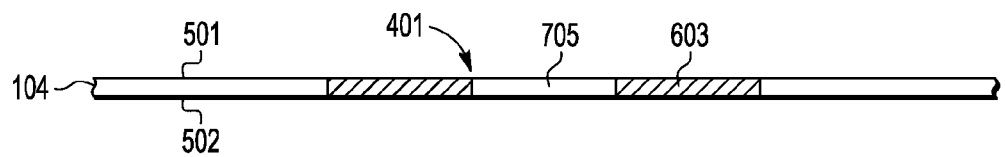
FIG. 8 is a cut view of the portion of the heat spreader of FIG. 7 along cut line 8-8', showing a first embodiment of the insulating material.

FIG. 8 is a cut view of the heat spreader 104 along cut line 8-8' of FIG. 7, for a first embodiment. In FIG. 8, surfaces of the insulator 603 are flush with each of the major surfaces 501, 502 of the heat spreader 104.

Figure 9:
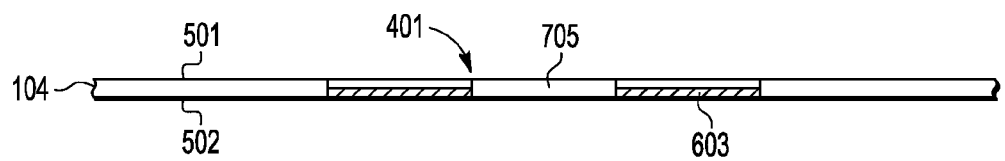
FIG. 9 is a cut view of the portion of the heat spreader of FIG. 7 along cut line 8-8', showing a second embodiment of the insulating material.

FIG. 9 is a cut view of the heat spreader 104 along cut line 8-8' of FIG. 7, for a second embodiment. In the second embodiment, the insulator 603 in the opening 401 of the heat spreader 104 is recessed from one or both of the major surfaces 501, 502 of the heat spreader. In FIG. 9, the insulator 603 is recessed from only the first major surface 501 of the heat spreader 104.

In one embodiment of making the insulated hole 705 in the opening 401, the insulated hole 705 is formed prior to placement of the heat spreader 104 onto either of the die 106, 108.

In another embodiment of making the insulated hole 705 in the opening 401, the second major surface 502 of the heat spreader 104 is placed and bonded or adhered onto die 108, wherein each approximately cylindrically-shaped opening 401 of the heat spreader approximately aligns with, i.e., is nearly collinear with, with an approximately cylindrically-shaped TSV 221-225 of die 108. Then, the insulator 603 is disposed in the opening 401 of the heat spreader 104. Then, the insulated hole 705 is formed in the insulator 603. Then, die 106 is placed and bonded or adhered onto the first major surface 501 of the heat spreader 104, wherein each TSV 121-125 of die 106 aligns with each opening 401 of the heat spreader.

When the heat spreader 104 is in the form of a piece part, oxide or nitride films could be used to form the insulator 603, which would likely require that the heat spreader be attached to a temporary backing (tape) or substrate for deposition. Excess material on the surface of the heat spreader 104 outside the opening 401 would then be removed through wet etching, dry etching, or polishing. In another embodiment, the insulator 603 is a non-electrically conductive polymer that is sprayed, deposited, evaporated, or coated onto the heat spreader 104. Again, excess material would then be removed. Adhesion between the insulator 603 and the heat spreader 104 keeps the insulator inside the opening 401. Alternatively, a stack of different dielectric materials, e.g., oxide with caps of polymer, could be used as the insulator 603 to achieve good electrical insulation while also maintaining the dielectric stack inside the opening 401 of the heat spreader 104.

Figure 10:
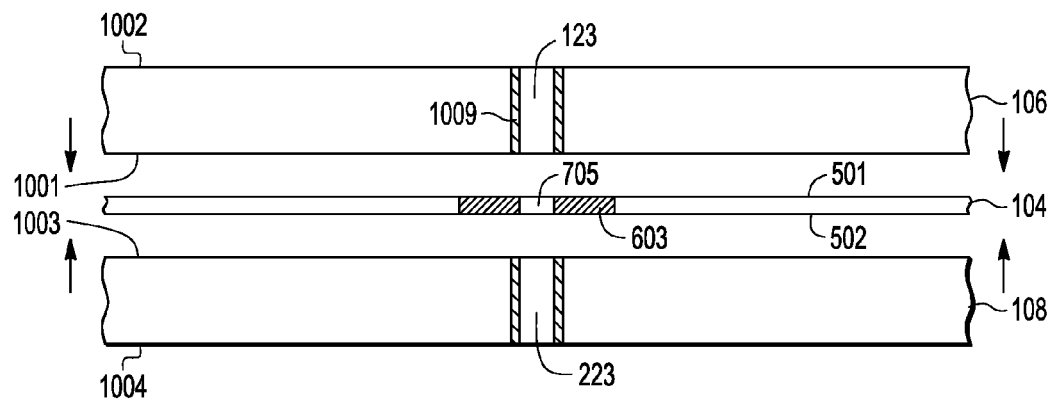
FIG. 10 is a cut view of a first die including a through silicon via, a heat spreader including an insulated hole, and a second die including a through silicon via.

Methods of Assembling a Stacked Microelectronic Structure when the Heat Spreader is in the Form of a Piece Part that Already has at Least One Insulated Hole FIG. 10 is a cut view of the first die 106 including TSV 123, the heat spreader 104 including the insulated hole 705, and the second die 108 including TSV 223. Die 106 has an active, or front, side 1001 and an inactive, or back, side 1002. Die 108 has a front side 1003 and a back side 1004. In one embodiment, a front side 1001 of die 106 and a front side 1003 of die 108 are thermally coupled to the heat spreader 104. The front side of a die is the heat-generating side of the die because the integrated circuitry is on the front side of the die. An insulating film (not shown) is disposed on a front side of a die when the front side of the die is to be thermally coupled to a heat spreader. However, when a heat spreader made of aluminum nitride, no insulating film is needed. In another embodiment (not shown), the back side 1002, 1004 of one or both of the die 106, 108 are thermally coupled to the heat spreader 104. The back side 1002, 1004 does not require an insulating film between the die 106, 108 and the electrically conductive heat spreader 104. The TSV 123, 223 includes an electrically insulating lining 1009 (hereinafter "lining"). In one embodiment, the lining 1009 is a dielectric such as silicon dioxide or silicon nitride. In one embodiment, the lining 1009 is an oxide. In one embodiment, prior to assembly into the stacked structure 101, the TSV 123, 223 of the respective die 106, 108 are pre-filled with an electrically conductive substance 1305 (see FIG. 13) within the lining 1009. The lining 1009 of the TSV 123, 223 electrically isolates the electrically conductive substance 1305 in the TSV from the die 106, 108, except where connections to circuitry on the die are selectively made. In one embodiment, such electrically conductive substance 1305 in the TSV 123, 223 is one of copper and tungsten. In another embodiment, such electrically conductive substance 1305 in the TSV 123, 223 is a conductive epoxy.

Figure 11:
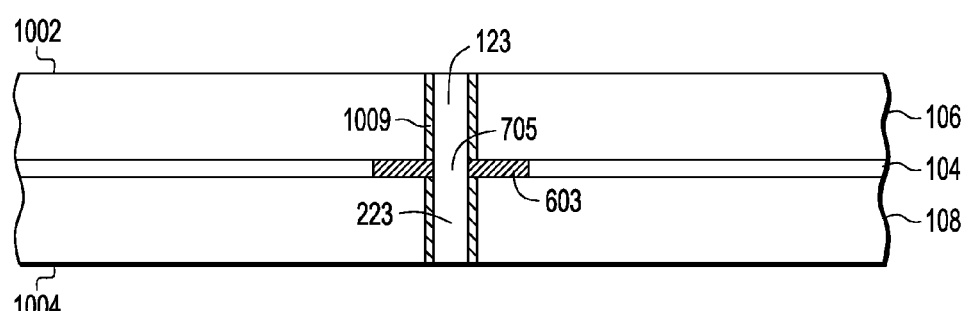
FIG. 11 is a cut view of the first die, the heat spreader and the second die of FIG. 10, subsequent to being brought together to form a stacked structure.
Figure 12:
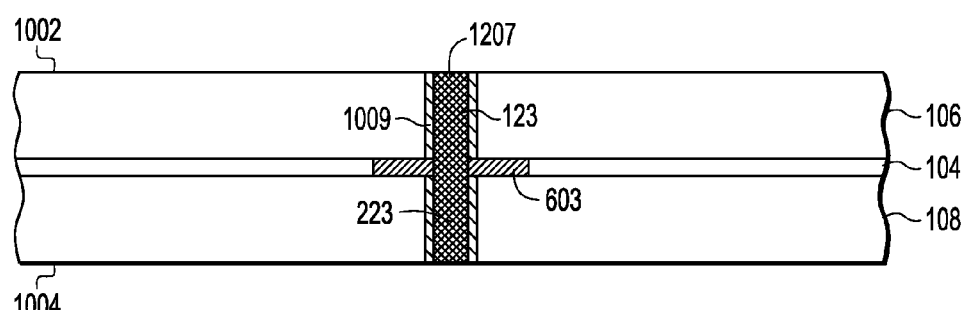
FIG. 12 is a cut view of the stacked structure of FIG. 11 subsequent to the through silicon vias and the insulated hole being filled with a continuous fill material.

Referring now to FIGS. 10-12. In one method (continuous fill) of manufacturing a microelectronic assembly, the heat spreader 104 is in the form of a piece part. In a first step of such method, at least two die 106, 108 each having a TSV 123, 223 that is not filled with any conductive material are provided, and a heat spreader 104 that has an insulated hole 705 that is not filled with any electrically conductive material is provided.

FIG. 11 is a cut view of the first die 106, the heat spreader 104 and the second die 108, subsequent to being brought together to form the stacked structure 101. In a second step, the heat spreader 104 is sandwiched between the two die 106, 108, with a die abutting the two major surfaces 501, 502 of the heat spreader and with the insulated hole 705 of the heat spreader aligned with the TSVs 123, 223 of the dies. In one embodiment, the front side 1001, 1003 of each die abuts one of the major surfaces 501, 502 of the heat spreader 104. As part of the second step, an adhesive may be used to keep the three pieces together.

FIG. 12 is a cut view of the stacked structure 101, subsequent to the TSVs 123, 223 and the insulated hole 705 being filled with a continuous fill material 1207. In a third step, the TSVs 123, 223 and the insulated hole 705 in the heat spreader 104 are filled, during a single action, or continuous process, with the fill material 1207. In other words, in the continuous fill method of manufacturing the microelectronic assembly 100, a same fill material is disposed in the TSVs 123, 223 and in the insulated hole 705 of the heat spreader 104. The fill material 1207 is electrically conductive. In one embodiment, the fill material 1207 is tungsten. In another embodiment, the fill material 1207 is copper.

Figure 13:
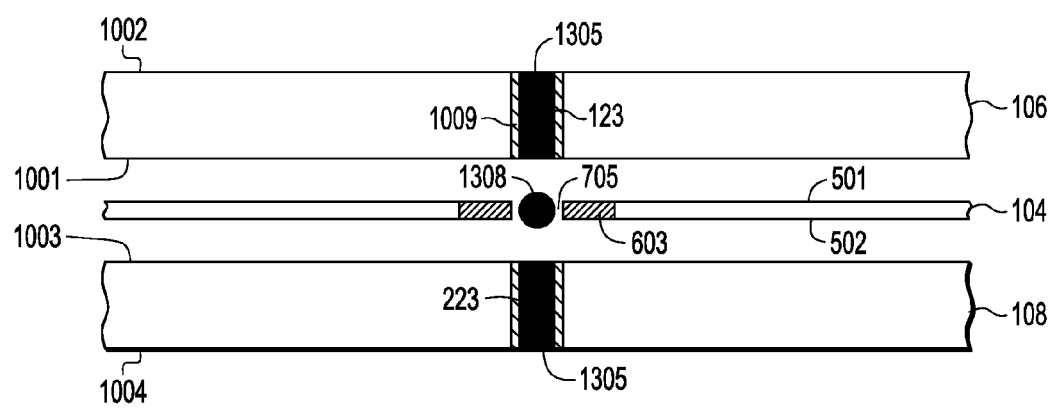
FIG. 13 is a cut view of a first die including a through silicon via, a heat spreader including an insulated hole, a second die including a through silicon via, and a solder ball at the insulated hole.

Referring now to FIG. 13. Another method of manufacturing the microelectronic assembly 100 when the heat spreader 104 is in the form of a piece part includes a solder ball. In a first step of such other method, at least two die 106, 108 each having a respective TSV 123, 223 that is pre-filled with an electrically conductive material are provided, and a heat spreader 104 that has an insulated hole 705 that is not filled with any electrically conductive material is provided. In a second step, the heat spreader 104 and one die 108 of the at least two die 106, 108 are brought together with the one die 106 abutting major surface 502 of the heat spreader and with the insulated hole 705 of the heat spreader aligned with the TSV 223 of the one die 108. In a third step, a solder ball 1308 is placed at the insulated hole 705 of the heat spreader 104. The solder ball 1308 has a volume of approximately equal to a volume of the insulated hole 705. A diameter of the solder ball 1308 is such that the solder ball can make contact (during step four) with electrically conductive substance 1305 in the TSVs 123, 223 with which the solder ball is intended to form an electrical connection. A diameter of the opening 401 in the heat spreader 104 is larger than a diameter of TSVs 123, 223 so that the solder ball 1308 does not create a "stand-off" that would hinder heat transfer between the die 106, 108 and the heat spreader 104. In a fourth step, another die 106 of the at least two die 106, 108 is brought together with the heat spreader 104 and the one die 108, with the other die 106 abutting the other major surface 501 of the heat spreader, and with the TSV 123 of the other die 106 aligned with the insulated hole 705 of the heat spreader. An adhesive may be used to keep the three pieces together. In a fifth step, the solder ball 1308 is reflowed, thereby forming an electrically conductive path between the die 106, 108. More specifically, after reflow of the solder ball 1308, an electrically conductive path is formed between the electrically conductive substance 1305 in TSV 123 of die 106 and the electrically conductive substance 1305 in TSV 223 of die 108. Because of the presence of the insulator 603 surrounding the solder in the heat spreader 104, the electrically conductive path between the two die 106, 108 is advantageously electrically isolated from the heat spreader.

In another embodiment, a B-staged, i.e., partially cured, conductive polymer ball (not shown) is used to connect the TSVs 123, 223 of the two die 106, 108. The B-staged conductive polymer ball is used instead of the solder ball 1308. The B-staged conductive polymer ball may have a lower attach temperature than the solder ball 1308 and may have longer fatigue life than solder.

Figure 14:
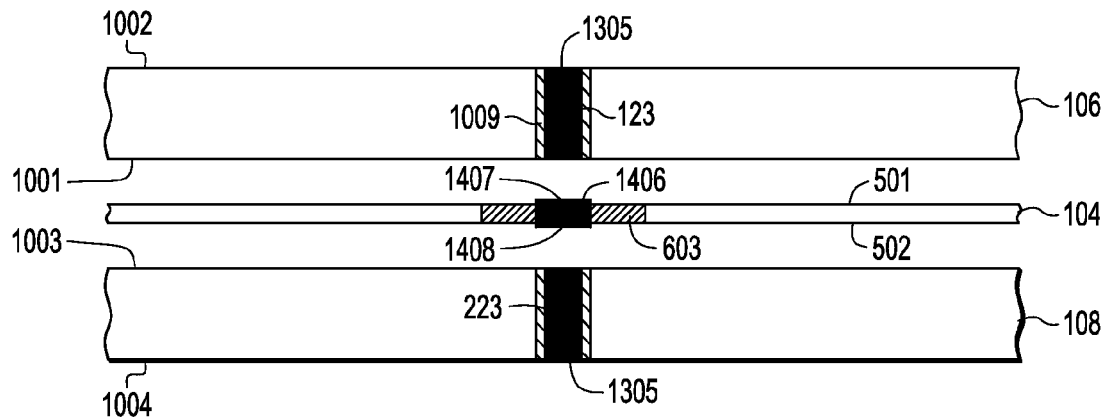
FIG. 14 is a cut view of a first die including a through silicon via, a heat spreader including an insulated hole, a second die including a through silicon via, and an interconnect element at the insulated hole.

Referring now to FIG. 14. Yet another method of manufacturing the microelectronic assembly 100 when the heat spreader 104 is in the form of a piece part, includes an interconnect element 1406 and a relatively thin solder cap (not shown). The interconnect element 1406 has a top surface 1407 and a bottom surface 1408. The relatively thin solder cap is added to the top surface 1407 and a bottom surface 1408 of the interconnect element 1406. In a first step in such yet another method, at least two die 106, 108 each having a respective TSV 123, 223 that is pre-filled with an electrically conductive material are provided, and a heat spreader 104 that has an insulated hole 705 that is not filled with any electrically conductive material is provided. In a second step, the insulated hole 705 of the heat spreader 104 is filled with an interconnect element 1406. The interconnect element 1406 is an electrical conductor. In one embodiment, the interconnect element 1406 is made of the same material as the heat spreader 104, e.g., copper. In a first variation, the top surface 1407 and the bottom surface 1408 of the interconnect element 1406 are planar with the major surfaces 501, 502, respectively, of the heat spreader 104. In a second variation, one or both of the top surface 1407 and the bottom surface 1408 of the interconnect element 1406 undergoes counter boring. As a result, in such second variation, one or both of the top surface 1407 and the bottom surface 1408 of the interconnect element 1406 is recessed from the respective major surface 501, 502 of the heat spreader 104. In the second variation, as shown in FIG. 9, the insulator 603 in the opening 401 of the heat spreader 104 may also be recessed from the major surfaces 501, 502 of the heat spreader, to provide an insulated region into which the solder of a solder cap can flow during step five. In a third step, a solder cap is placed on the top surface 1407 and on the bottom surface 1408 of the interconnect element 1406. In a fourth step, the heat spreader 104 is sandwiched between the two die 106, 108, with the insulated hole 705 of the heat spreader aligned with the TSVs 123, 223 of the respective dies 106, 108. An adhesive may be used to keep the three pieces together. In a fifth step, the solder cap is reflowed, thereby forming, in conjunction with the interconnection element 1406, an electrically conductive path between the first die 106 and the second die 108.

Methods of Forming a Heat Spreader by Depositing a Layer of Metal onto a Die;

Forming Openings in the Heat Spreader; Placing an Insulator in the Opening; and Forming Insulated Holes in the Insulator In other embodiments, the heat spreader 104 is formed by depositing a layer, e.g., a film, of a metal onto a die which, at the time of depositing, may be part of a wafer or may be a singulated die. In one embodiment, the film of metal is deposited onto the die. In such embodiment, the film of metal becomes the heat spreader 104. In one embodiment, the depositing of the layer of metal is accomplished by plating in a bath or by sputtering. Typically, the film of the metal so deposited has a thickness in the range of about 5 µm to 10 µm.

Metal Polish

In one of such other embodiments in which the heat spreader 104 is formed by depositing a layer of metal onto a die, a metal that is difficult to etch but easy to polish is deposited onto the die. One example of such a metal is copper.

FIG. 15 is a top plan view of area 15 of die 108 after the TSV 223, including lining 1009, is filled with the electrically conductive substance 1305. FIG. 15 shows area 15 of die 108 prior to formation of the heat spreader 104 on the front side 1003. In another embodiment, the heat spreader 104 is formed on the back side 1004 of the die 108. Prior to formation of the heat spreader 104 on the front side 1003 of the die 108, one or more passivation layers (not shown) are added to the front side. No passivation layer is required when a heat spreader is formed on a back side of a die.

Figure 16:
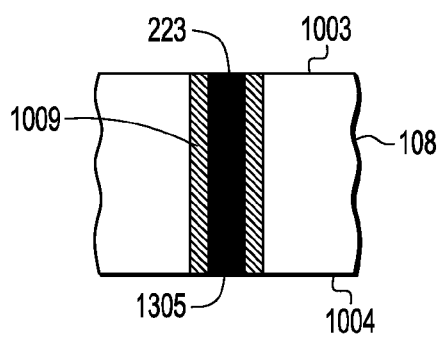
FIG. 16 is a cut view of FIG. 15 along cut line 16-16'.

FIG. 16 is a cut view of FIG. 15 along cut line 16-16'. TSV 223 extends between the front side 1003 and the back side 1004 of die 108, and the electrically conductive substance 1305 is shown surrounded by the lining 1009 in the TSV 223. The die 108 may part of a wafer or singulated die. The die may be silicon or another semiconductor material. The die 108 contains electrical circuits on the front side 1003 of the die. The TSV 223 electrically connects circuitry on the front side 1003 of die 108 to the back side 1004 of the die. The lining 1009 prevents electrical power or electrical signals carried by the TSV 223 from electrically connecting to the die 108, except where an electrical connection is intended.

Figure 17:
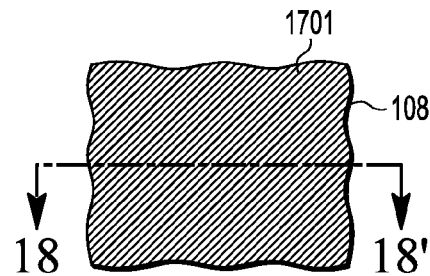
FIG. 17 is a top plan view of area 15 of the bottom die subsequent to deposition of a dielectric on a front side of the bottom die, showing a cut line 18-18'.
Figure 18:
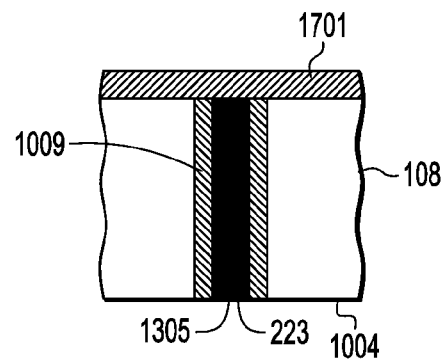
FIG. 18 is a cut view of FIG. 17 along cut line 18-18'.

Referring now to FIG. 17. In a next step in a method of forming the heat spreader 104, a dielectric 1701 is deposited onto an entire front side 1003 of die 108. In one embodiment, the dielectric 1701 may be silicon dioxide, silicon nitride or a non-electrically conductive polymer. FIG. 17 is a top plan view of area 15 of die 108 subsequent to deposition of the dielectric 1701 on the front side 1003 of the die, showing a cut line 18-18'. FIG. 18 is a cut view of FIG. 17 along cut line 18-18'.

Figure 19:
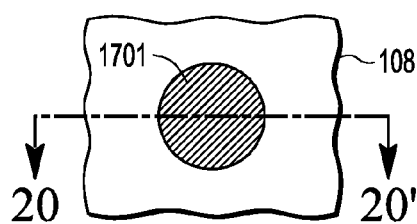
FIG. 19 is a top plan view of area 15 of the bottom die subsequent to selective removal of the dielectric on the front side of the bottom die, showing a cut line 20-20'.
Figure 20:
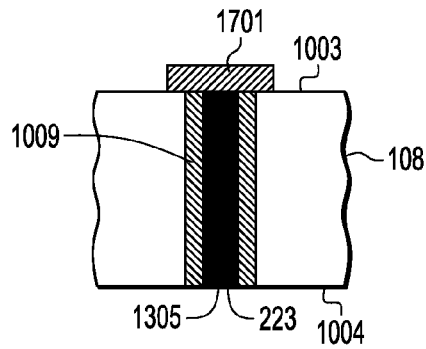
FIG. 20 is a cut view of FIG. 19 along cut line 20-20'.

Referring now to FIG. 19. Most of the dielectric 1701 is selectively removed by photolithography or dry etching. The portion of the dielectric 1701 above the TSV 223 and above a small region around the TSV is not removed. FIG. 19 is a top plan view of area 15 of die 108 subsequent to selective removal of the dielectric 1701 on the front side 1003 of die 108, showing a cut line 20-20'. FIG. 20 is a cut view of FIG. 19 along cut line 20-20'. FIGS. 19 and 20 show the result of patterning of the dielectric 1701 to form caps over the TSV 223 on the front side 1003 of die 108.

Figure 21:
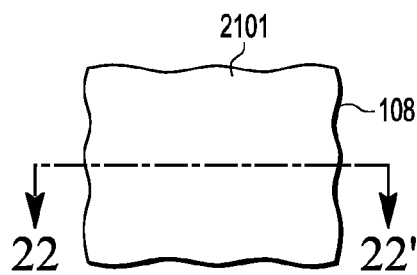
FIG. 21 is a top plan view of area 15 of the bottom die subsequent to deposition of a metal on the front side of the bottom die, showing a cut line 22-22'.
Figure 22:
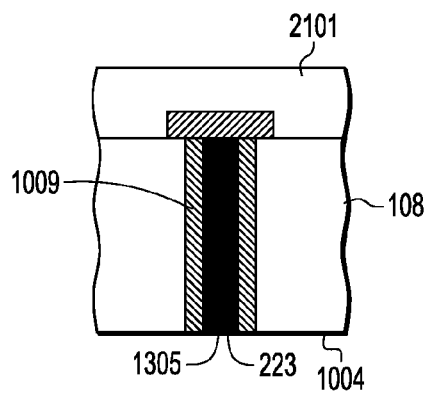
FIG. 22 is a cut view of FIG. 21 along cut line 22-22'.

Referring now to FIG. 21. In next step, copper 2101 or another metal in another embodiment, is deposited onto an entire front side of die 108, such as by plating. FIG. 21 is a top plan view of area 15 of die 108 subsequent to deposition of the copper 2101 on the front side 1003 of die 108, showing a cut line 22-22'. FIG. 22 is a cut view of FIG. 21 along cut line 22-22'. FIGS. 21 and 22 show the result of forming the heat spreader 104 by depositing a film, or layer, of copper 2101 onto the front side 1003 of die 108. During the formation of a copper film, a barrier layer (not shown) such as Ti, TiN, Ta and TaN may be used to aid the formation of the copper film.

Figure 23:
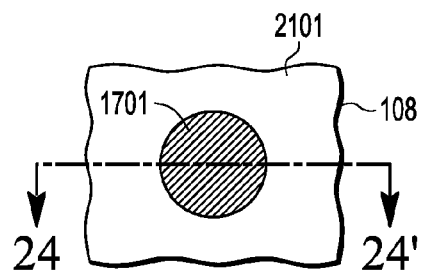
FIG. 23 is a top plan view of area 15 of the bottom die subsequent to polish or etchback of the metal on the front side of the bottom die, showing a cut line 24-24'.
Figure 24:
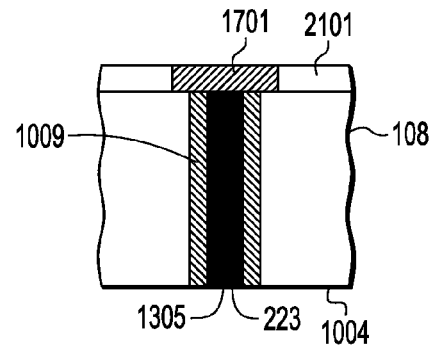
FIG. 24 is a cut view of FIG. 23 along cut line 24-24'.

Referring now to FIG. 23. FIG. 23 is a top plan view of area 15 of die 108 subsequent to polish or etchback of the copper 2101 on the front side 1003 of the die, showing a cut line 24-24'. In this step, chemical mechanical planarization (CMP) of the copper may be performed. FIG. 24 is a cut view of FIG. 23 along cut line 24-24'. FIGS. 23 and 24 show the results of copper polish or etchback to expose the dielectric 1701 above the TSV 223 on the die 108. The remaining film of copper 2101 may be approximately coplanar with the tops of the dielectric 1701, which allows a film copper on die 108 to act as the heat spreader 104 for both the die 106 and the die 108 after the two die and the heat spreader are assembled. In another embodiment, the copper film may be lower or higher than the tops of the dielectric 1701 as required to make contact between the heat spreader 104 and the die 106 during assembly of the stacked structure 101.

Figure 25:
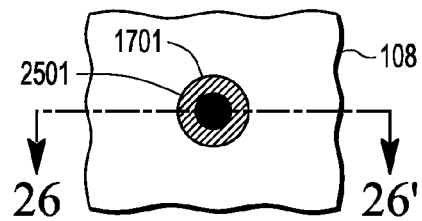
FIG. 25 is a top plan view of area 15 of the bottom die subsequent to selective removal of the dielectric on the front side of the bottom die, showing a cut line 26-26'.
Figure 26:
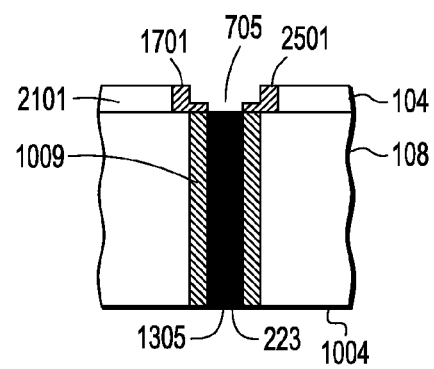
FIG. 26 is a cut view of FIG. 25 along cut line 26-26'.

Referring now to FIG. 25. FIG. 25 is a top plan view of area 15 of die 108 subsequent to selective removal of the dielectric 1701 on the front side 1003 of the die, showing a cut line 26-26'. FIG. 26 is a cut view of FIG. 25 along cut line 26-26'. FIGS. 25 and 26 show a patterned dielectric cap 2501 above the TSV of die 108. Patterning may be accomplished through lithographic patterning and dry etching or other conventional methods. At this step, the insulated hole 705 in the patterned dielectric cap 2501 is formed which exposes the underlying electrically conductive substance 1305 of the TSV 223. The patterned dielectric cap 2501 advantageously prevents electrical contact between the electrically conductive substance 1305 in the TSV 223 and the rest of the die 108 and/or the heat spreader 104 (in this embodiment, the film of copper 2101). In one embodiment, the insulated hole 705 in the dielectric cap 2501 may be counter bored, counter sunk, tapered or recessed to provide additional space for the solder bond 1308 to expand laterally during assembling without allowing an electrical connection between the solder bond and the die 108 and/or the heat spreader 104.

Figure 27:
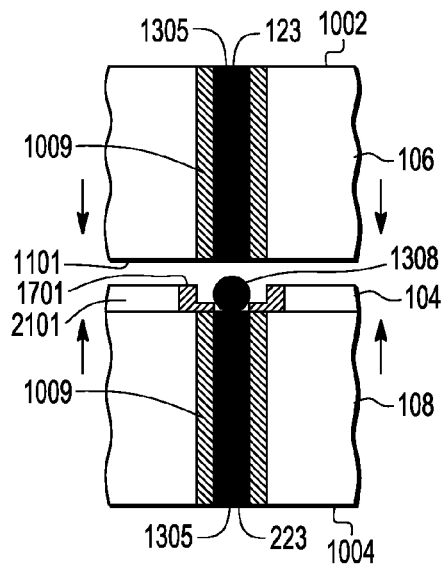
FIG. 27 is an enlarged view of area 27 of FIG. 3, for an embodiment corresponding to FIGS. 15-26.

Referring now to FIG. 27, a solder ball 1308 is placed at the insulated hole of the dielectric cap 2501 of die 108. Alternative, copper studs or similar bonding techniques may be used. The ball bond creates an electrical connection between the electrically conductive substance 1305 of TSV 223 of die 108 and the electrically conductive substance 1305 of TSV 123 of die 106, while the dielectric cap 2501 advantageously prevents a short between the ball bond and other portions of the die 108 and/or the heat spreader 104 from occurring. FIG. 27 shows die 108, the heat spreader 104 and the die 106 just prior to assembly into the stacked structure 101. Next, die 106 is placed such that it is thermally coupled to a surface of the heat spreader 104 that is opposite of die 108 such that the TSV of die 106 is aligned with the solder ball 1308. Then, the solder ball 1308, and possibly also the electrically conductive substance 1305, is reflowed.

Metallic Subtractive Etch

In another of such other embodiments in which a layer of metal is deposited onto a die, a metal that is easy to etch, but may or may not be easy to polish, is deposited onto the die. An example of such a metal is aluminum.

Referring again to FIGS. 15 and 16, a top plan view of area 15 of die 108 prior to formation of the heat spreader 104 on the front side 1003 of die 108, and a cut view thereof are illustrated, which shows the starting point of the metallic subtractive etch method.

Figure 28:
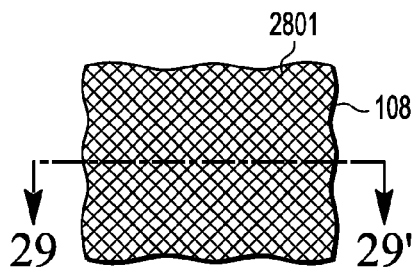
FIG. 28 is a top plan view of area 15 of the bottom die subsequent to deposition of a metal on a front side of the bottom die, showing a cut line 29-29'.
Figure 29:
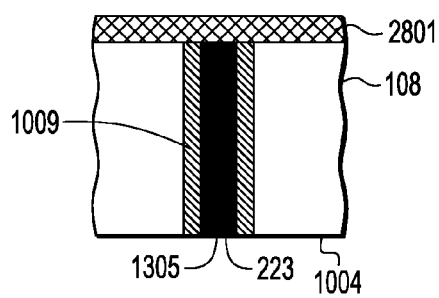
FIG. 29 is a cut view of FIG. 28 along cut line 29-29'.

Referring now to FIG. 28. In a next step of the metallic subtractive etch method, aluminum 2801 or another metal in another embodiment, is deposited, such as by sputtering, onto the entire front side 1003 of die 108, thereby producing an aluminum film, or layer. FIG. 28 is a top plan view of area 15 of die 108 subsequent to deposition of the aluminum 2801 on the front side 1003 of die 108, showing a cut line 29-29'. FIG. 29 is a cut view of FIG. 28 along cut line 29-29'. During the formation of an aluminum film, a barrier layer (not shown) such as Ti, TiN, Ta and TaN may be used to aid the formation of the aluminum film.

Figure 30:
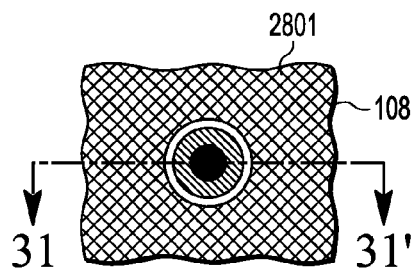
FIG. 30 is a top plan view of area 15 of the bottom die subsequent to selective removal of some of the metal, showing a cut line 31-31'.
Figure 31:
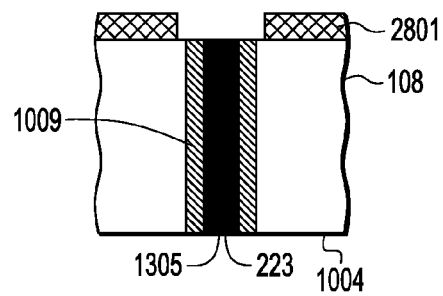
FIG. 31 is a cut view of FIG. 30 along cut line 31-31'.

Referring now to FIG. 30. In a next step, the film of aluminum 2801 is patterned through subtractive etch. Subtractive etch of the aluminum film removes the aluminum 2801 near the TSV 223 thereby creating the opening 401, which is a region free of aluminum. The aluminum 2801 is selectively removed by photolithography or etching. FIG. 30 is a top plan view of area 15 of die 108 subsequent to selective removal of some of the aluminum 2801, showing a cut line 31-31'. FIG. 31 is a cut view of FIG. 30 along cut line 31-31'.

Figure 32:
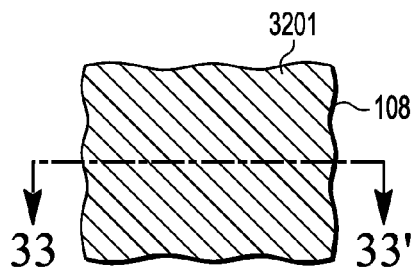
FIG. 32 is a top plan view of area 15 of the bottom die subsequent to deposition of a dielectric onto the front side of the bottom die, showing a cut line 33-33'.
Figure 33:
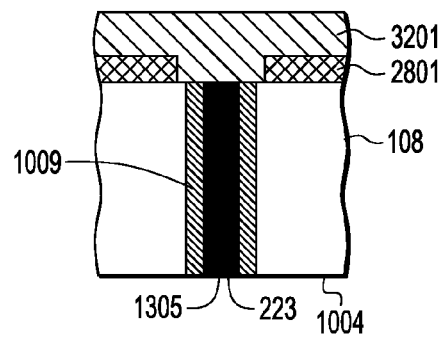
FIG. 33 is a cut view of FIG. 32 along cut line 33-33'.

Referring now to FIG. 32. In a next step, a dielectric 3201 is placed over the aluminum film including in the opening 401 above the TSV 223 of the die 108. Oxide deposition followed by oxide polish or etchback may be used to fill the aluminum-free region above the TSV 223. FIG. 32 is a top plan view of area 15 of die 108 subsequent to deposition of the dielectric 3201 onto the front side 1003 of the die, showing a cut line 33-33'. FIG. 33 is a cut view of FIG. 32 along cut line 33-33'.

Figure 34:
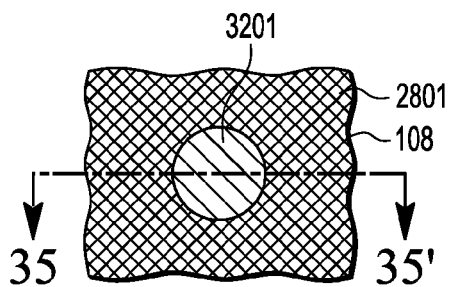
FIG. 34 is a top plan view of area 15 of the bottom die subsequent to selective removal of some of the dielectric, showing a cut line 35-35'.
Figure 35:
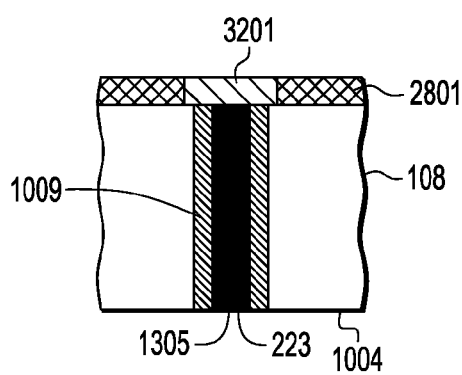
FIG. 35 is a cut view of FIG. 34 along cut line 35-35'.

Referring now to FIG. 34. In a next step, CMP or etchback is performed on only the dielectric 3201, and not on the aluminum 2801. FIG. 34 is a top plan view of area 15 of die 108 subsequent to selective removal of some of the dielectric 3201, showing a cut line 35-35. FIG. 35' is a cut view of FIG. 34 along cut line 35-35'.

Figure 36:
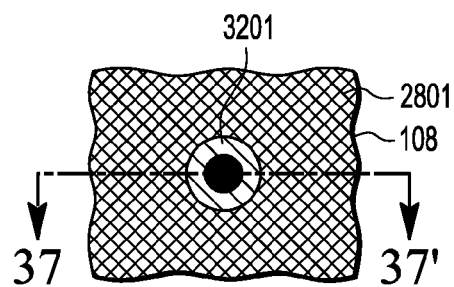
FIG. 36 is a top plan view of area 15 of the bottom die subsequent to further selective removal of some of the dielectric, showing a cut line 37-37'.
Figure 37:
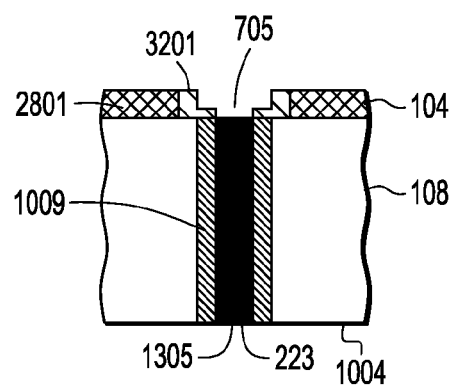
FIG. 37 is a cut view of FIG. 36 along cut line 37-37'.

Referring now to FIG. 36. In a next step, the dielectric 3201 is then patterned to expose the electrically conductive substance 1305 of the TSV 223 while electrically separating the heat spreader 104 (in this embodiment, the film of aluminum 2801) from the electrically conductive substance 1305 of the TSV. FIG. 36 is a top plan view of area 15 of die 108 subsequent to further selective removal of some of the dielectric 3201, showing a cut line 37-37'. FIG. 37 is a cut view of FIG. 36 along cut line 37-37'.

Figure 38:
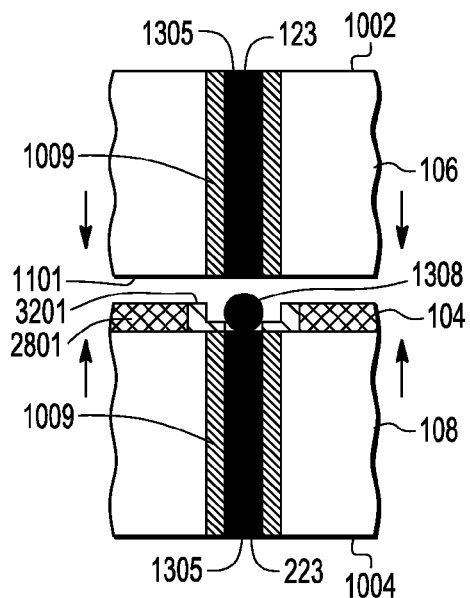
FIG. 38 is an enlarged view of area 38 of FIG. 3, for an embodiment corresponding to FIGS. 28-37.

FIG. 38 is an enlarged view of area 38 of FIG. 3, for an embodiment corresponding to FIGS. 28-37. FIG. 38 shows die 108, the heat spreader 104 and the die 106 just prior to assembly into the stacked structure 101. Next, die 106 is placed such that it is thermally coupled to a surface of the heat spreader 104 that is opposite of die 108 such that the TSV of die 106 is aligned with the solder ball 1308. Then, the solder ball 1308, and possibly also the electrically conductive substance 1305, is reflowed.

Figure 39:
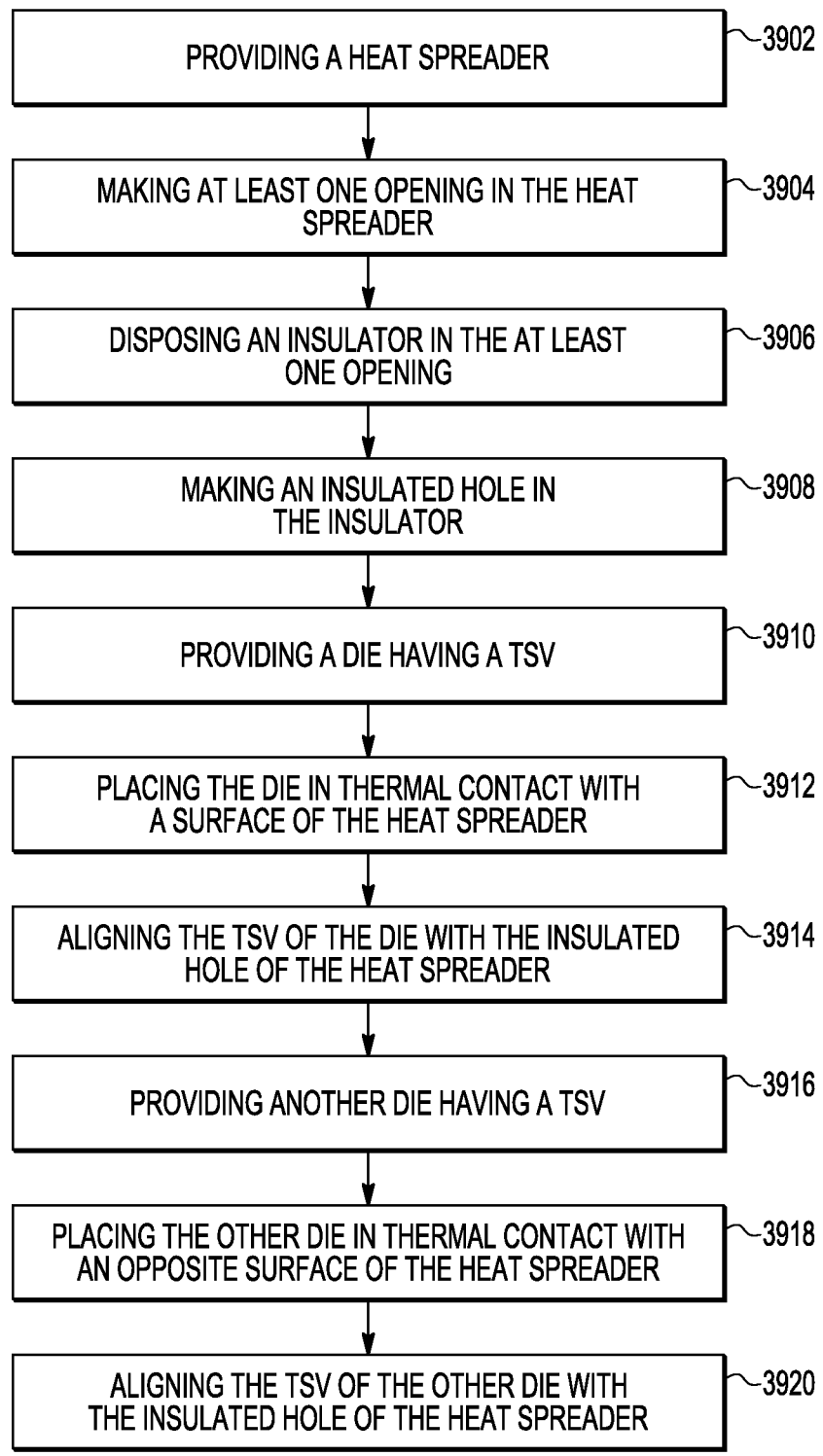
FIG. 39 is a flow diagram illustrating a method of manufacturing the stacked structure, in accordance with one embodiment of the invention.

FIG. 39 is a flow diagram 3900 illustrating a method of manufacturing the stacked structure 101, in accordance with one embodiment of the invention. At step 3902, the heat spreader 104 is provided. At step 3904, the opening 401 is made in the heat spreader 104. At step 3906, the insulator 603 is disposed in the opening 401. At step 3908, the insulated hole 705 is made in the insulator 603. At step 3910, the die 108 that has the TSV 223 is provided. At step 3912, the die 108 is placed such that it is thermally coupled to a major surface 502 of the heat spreader 104. At step 3914, the TSV 223 of the die 108 is aligned with the insulated hole 705 of the heat spreader 104. At step 3916, the die 106 that has the TSV 123 is provided. In one variation, in a next step, a solder ball 1308 is placed at the insulated hole 705. At step 3918, the die 106 is placed such that it is thermally coupled to a major surface 501 of the heat spreader 104. At step 3920, the TSV 1223 of the die 106 is aligned with the insulated hole 705 of the heat spreader 104. In another variation, in a subsequent step, the TSV 223 of die 108, the insulated hole 705 of the heat spreader 104 and the TSV 123 of die 106 are filled with an electrically conductive continuous fill material 1207 in a single action.

Figure 40:
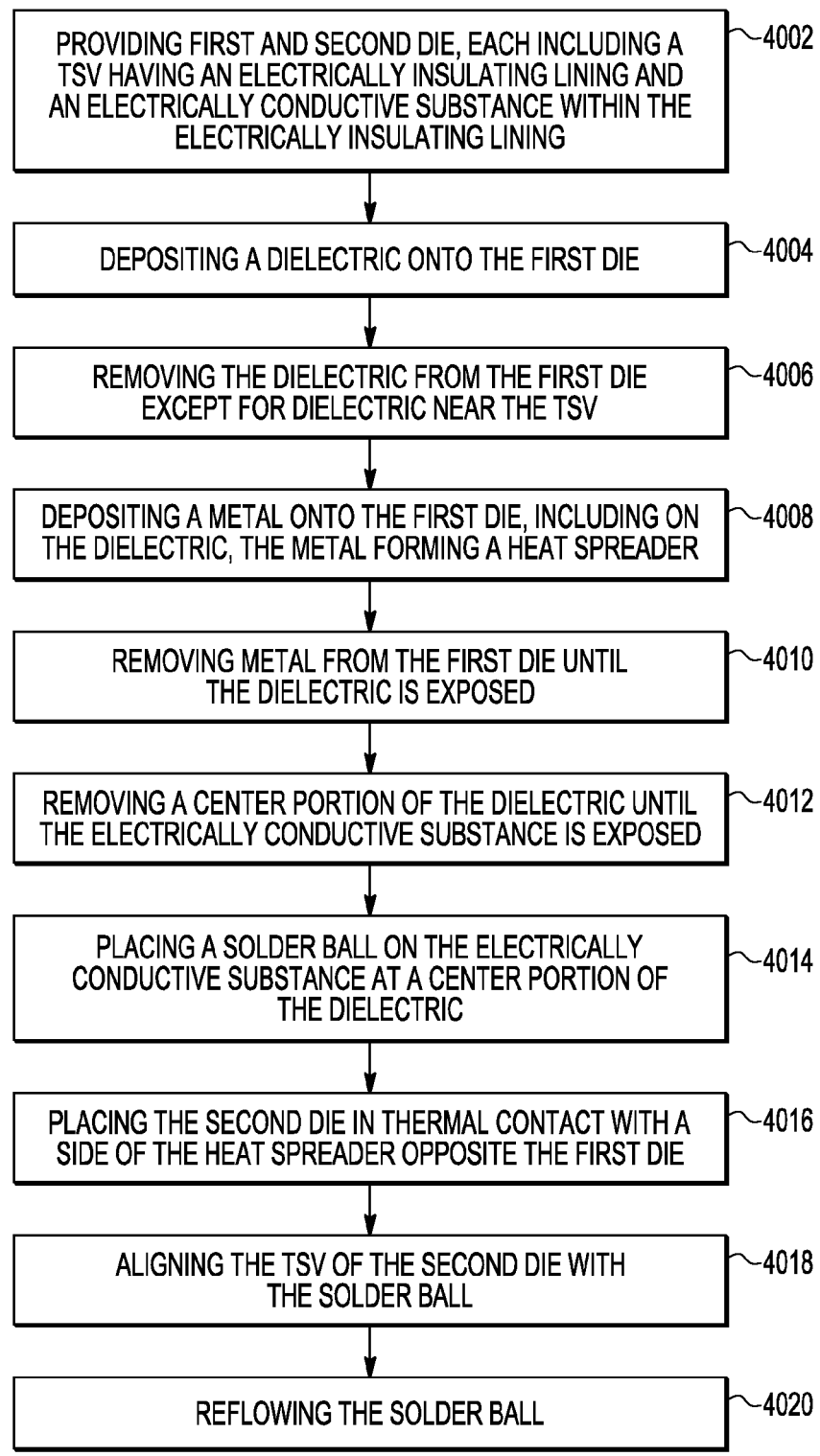
FIG. 40 is a flow diagram illustrating a method of manufacturing the stacked structure, in accordance with another embodiment of the invention.

FIG. 40 is a flow diagram 4000 illustrating a method of manufacturing the stacked structure 101, in accordance with another embodiment of the invention. At step 4002, die 106 and 108 are provided, each die having a TSV 123, 223 that has an insulating lining 1009 and an electrically conductive substance 1305 within the electrically insulating lining. At step 4004, a dielectric 1701 is deposited onto an entire front side 1003 (or back side 1005) of the die 108. At step 4006, the dielectric is removed except for the dielectric 1701 on, and slightly beyond, the TSV 223 of die 108. At step 4008, a film or layer of metal 2101, which forms the heat spreader 104, is deposited onto the front side 1003 of the die 108. At step 4010, the metal 2101 is removed until the dielectric 1701 becomes exposed. At step 4012, a center portion of the dielectric 1701 is removed until the electrically conductive substance 1305 becomes exposed. At step 4014, a solder ball 1308 is placed on the electrically conductive substance 1305 at the center portion of the dielectric 1701. At step 4016, the die 106 is placed such that it is thermally coupled to a side of the heat spreader 104 opposite the die 108. At step 4018, the TSV 123 of die 106 is aligned with the solder ball 1308. At step 4020, the solder ball 1308 is reflowed, thereby creating an electrical connection between the electrically conductive substance 1305 in the TSV 123 of die 106 and the electrically conductive substance 1305 in the TSV 223 of die 108.

Figure 41:
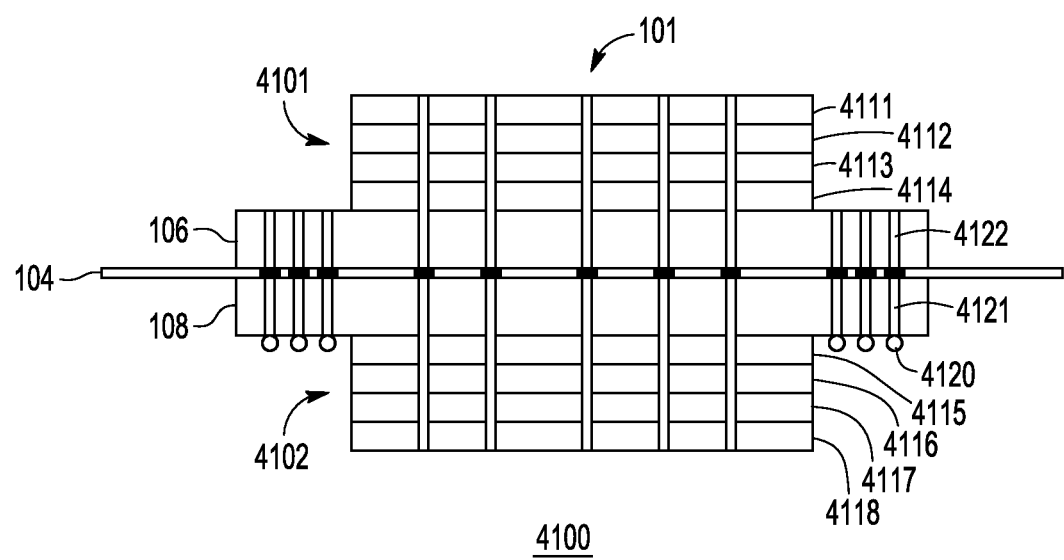
FIG. 41 is a cut view of a microelectronic device including a plurality of die and a heat spreader sandwiched between the plurality of die, in accordance with one embodiment of the invention.

FIG. 41 is a cut view of a microelectronic device 4100 that includes the stacked structure 101, in accordance with one embodiment of the invention. The microelectronic device 4100 includes die 106, 108 and heat spreader 104 sandwiched between the die. The microelectronic device 4100 includes a first stack 4101 of die comprising die 106 and 4111-4114, and a second stack 4102 of die comprising die 108 and die 4115-4118. In one embodiment, die 106 and 108 are microprocessors and die 4111-4118 are memory. The microelectronic device 4100 includes a plurality of flip chip bumps 4120. The microelectronic device 4100 includes a plurality of TSVs 4121 on one side of the heat spreader 104 and a plurality of TSVs 4122 on an opposite side of the heat spreader. Each TSV 4121 is electrically coupled to one of the TSVs 4122 via an insulated hole 705. Each flip chip bump 4120 is electrically coupled to one of the TSVs 4121. Each flip chip bump 4120 can be electrically coupled to a conductive pathway in a package substrate (not shown) within a microelectronic package. In some embodiments, the heat spreader 104 of the microelectronic device 4100 is thermally coupled to a heat sink.

In another embodiment (not shown), one of more TSVs 123-125 and 221-225 may be intentionally electrically connected to the heat spreader 104. This electrical connection may advantageously create a ground connection for circuitry in the die 106, 108.

In some embodiments, an adhesive may be added between the heat spreader 104 and the die 106, 108. In one embodiment, the adhesive is added prior to making the at least one opening 401 in the heat spreader 104. In another embodiment, the adhesive is added after making the at least one opening 401 in the heat spreader 104 using a stencil that prevents adhesive being applied near the at least one opening. In one embodiment, the adhesive may be selected from the group of epoxies including thermoset, thermoplastic and B-staged or the like.

In one embodiment of the stacked structure 101, the at least one die comprises a stack of dies. In such embodiment, dies are arranged into stacks prior to placing the stack such that it is thermally coupled to the heat spreader 104. When such stack is formed, the dies can be already singulated, or the dies can be in wafer form and a stack of wafers is then singulated. The at least one insulated hole 705 in the heat spreader 104 can be used in conjunction with a TSV that extends through such stack of dies.

In one embodiment of the stacked structure 101, a plurality of stacks is placed such that it is thermally coupled to the heat spreader 104. In such embodiment, the insulated holes 705 in the heat spreader 104 can be used in conjunction with a plurality of TSVs, the TSV extending through a different stack of such plurality of stacks.

The insulated holes 705 in the heat spreader 104 can be used in conjunction with various types of stacks and various types of die. For example, a stack could be interleaved or not interleaved, a stack could be staggered or not staggered, each die could be of a same type or each die could be of a different type (e.g., processor, memory, etc.), and each die could have the same dimensions (i.e., area and/or thickness) or could have different dimensions.

In one embodiment, one or both die 106 and die 108 comprise one or more microprocessors. A die that comprises a microprocessor is typically much larger in area than a die of memory. When one or both die 106 and die 108 comprise a microprocessor, each die 106, 108 may have four memory die, one memory die in each quadrant of the die 106, 108. Each such memory die may include a stack of a plurality of memory die. When dies of microprocessors and dies of memory are in a stack, the dies of the microprocessors are placed directly adjacent to each side of the heat spreader because a typical die of a microprocessor may generate 10 W or more of heat, whereas die of memory may generate only 0.5 W of heat. The insulated holes 705 allow memory that is stacked on one microprocessor to be accessed by the other microprocessor in spite of each microprocessor being on an opposite side of the heat spreader 104.

By now it should be appreciated that a heat spreader 104 located between two die 106, 108 has been disclosed, wherein a region of the heat spreader between the two die includes at least one insulated hole 705 for isolated electrically coupled vias to extend through the heat spreader from one of the two die to the other of the two die.

In one embodiment, a method of manufacturing the microelectronic device 4100 comprises providing the heat spreader 104 which has the first major surface 501 and the second major surface 502 opposite the first major surface. The heat spreader has the opening 401, the insulator 603 in the opening, the electrically insulated through hole 705 in the insulator, and the electrically conductive material 1308, 1406 in the electrically insulated through hole. The method further comprises providing the first die 106 and the second die 108, each die having the through via 123, 223 and the electrically conductive substance 1305 therein; thermally coupling the first die 106 to at least a portion of the first major surface 501 of the heat spreader 104, the portion including the opening 401, wherein the first die is located with respect to the first major surface of the heat spreader; and thermally coupling the second die 108 to at least a portion of the second major surface 502 of the heat spreader, the portion including the opening, wherein the second die is located with respect to the second major surface of the heat spreader. The electrically conductive material 1308, 1406 in the electrically insulated through hole 705 of the heat spreader 104 is coupled to the electrically conductive substance 1305 in the through via 123 of the first die 106 and to the electrically conductive substance 1305 in the through via 223 of the second die 108.

In another embodiment, a method of manufacturing the microelectronic assembly 100 comprises providing the first die 106 that has at least one through via 223. The at least one through via has the electrically insulating lining 1009 and the electrically conductive substance 1305 therein. The thermally conductive material 2101, 2801 is located on the surface 1003 of the first die and is thermally coupled to the first die. The thermally conductive material defines the opening 401 in the thermally conductive material. The dielectric material 1701, 3201 is located in the opening. The dielectric material defines the hole 705 in the dielectric material. The hole includes the electrically conductive material 1308, 1406. The method further includes thermally coupling the second die 108 to the thermally conductive material 2101, 2801 located on the surface 1003 of the first die 106. The second die has at least one through via 123 having the electrically insulating lining 1009. The at least one through via has the electrically conductive substance 1305 within a volume defined by the electrically insulating lining. The electrically conductive material 1308 in the hole 705 is electrically coupled to the electrically conductive substance 1305 in the through via 223 of the first die 106 and to the electrically conductive substance 1305 in the through via 123 of the second die 108.

In still another embodiment, a method of manufacturing the microelectronic assembly 100 comprises the steps of providing the heat spreader 104 which has the first major surface 501 and the second major surface 502 opposite the first major surface; thermally coupling at least one die 106 to at least a portion of the first major surface of the heat spreader; thermally coupling at least one other die 108 to at least a portion of the second major surface of the heat spreader; forming the opening 401 in the heat spreader, the opening located in a region of the heat spreader between the at least one die and the at least one other die; disposing the insulator 603 in the opening to produce an electrically insulated through hole 705 in the insulator; and disposing electrically conductive material 1308, 1406 in the electrically insulated through hole in the insulator.

The term "align" includes approximately or nearly align such that the electrically conductive material, e.g., the solder ball 1308, in the insulated hole 705 is electrically coupled to the electrically conductive substance 1305 in the TSV 223 of the first die 106 and to the electrically conductive substance 1305 in the TSV 123 of the second die 108.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Note that the term "couple" has been used to denote that one or more additional elements may be interposed between two elements that are coupled.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims.

The Detailed Description section, and not the Abstract section, is intended to be used to interpret the claims. The Abstract section may set forth one or more but not all embodiments of the invention, and the Abstract section is not intended to limit the invention or the claims in any way.

Although the invention is described herein with reference to specific embodiments, various modifications and changes can be made without departing from the scope of the present invention as set forth in the claims below.

What is claimed is:

1. A method of manufacturing a microelectronic device, comprising:
   providing a heat spreader having a first major surface and a second major surface opposite the first major surface, wherein the heat spreader has an opening, an insulator in the opening, an electrically insulated through hole in the insulator, and electrically conductive material in the electrically insulated through hole;
   providing a first die and a second die, each die having a through via and an electrically conductive substance therein;
   thermally coupling the first die to at least a portion of the first major surface of the heat spreader, the portion including the opening, wherein the first die is located with respect to the first major surface of the heat spreader; and
   thermally coupling the second die to at least a portion of the second major surface of the heat spreader, the portion including the opening, wherein the second die is located with respect to the second major surface of the heat spreader;
   wherein the first die includes a first surface of an electrically conductive material electrically coupled to the electrically conductive substance of the through via of the first die prior to the thermally coupling the first die;
   wherein the second die includes a first surface of an electrically conductive material electrically coupled to the electrically conductive substance of the through via of the second die prior to the thermally coupling the second die;
   disposing electrically conductive material in the electrically insulated through hole, wherein the step of disposing electrically conductive material in the electrically insulated through hole comprises placing a solder ball at the electrically insulated through hole prior to thermally coupling the at least a second die to the at least a portion of the second major surface of the heat spreader;
   wherein the disposing further comprises reflowing the solder ball after the thermally coupling the first die and the thermally coupling the second die, wherein as result of the reflowing, material of the solder ball electrically contacts the first surface of the electrically conductive material of the first die and electrically contacts the first surface of the electrically conductive material of the second die;
   wherein the electrically conductive material in the electrically insulated through hole of the heat spreader is coupled to the electrically conductive substance in the through via of the first die and to the electrically conductive substance in the through via of the second die.

2. The method of manufacturing a microelectronic device of claim 1, including a plurality of flip chip bumps, at least one flip chip bump of the plurality of flip chip bumps electrically coupled to a through via of one or both of the first die and the second die.

3. A method of manufacturing a microelectronic device, comprising:
   providing a heat spreader having a first major surface and a second major surface opposite the first major surface, wherein the heat spreader has an opening, an insulator in the opening, an electrically insulated through hole in the insulator, and electrically conductive material in the electrically insulated through hole;
   providing a first die and a second die, each die having a through via and an electrically conductive substance therein;
   thermally coupling the first die to at least a portion of the first major surface of the heat spreader, the portion including the opening, wherein the first die is located with respect to the first major surface of the heat spreader;
   thermally coupling the second die to at least a portion of the second major surface of the heat spreader, the portion including the opening, wherein the second die is located with respect to the second major surface of the heat spreader;
   wherein the electrically conductive material in the electrically insulated through hole of the heat spreader is coupled to the electrically conductive substance in the through via of the first die and to the electrically conductive substance in the through via of the second die;
   disposing electrically conductive material in the electrically insulated through hole;
   wherein the step of disposing electrically conductive material in the electrically insulated through hole comprises filling the electrically insulated through hole in the heat spreader, filling the through via of the at least a first die and filling the through via of the at least a second die with an electrically conductive continuous fill material in a continuous process subsequent to thermally coupling the at least a second die to the at least a portion of the second major surface of the heat spreader.

4. A method of manufacturing a microelectronic assembly, comprising:
   providing a first die having at least one through via, the at least one through via having an electrically insulating lining and an electrically conductive substance therein, wherein a thermally conductive material is located on a surface of the first die and thermally coupled to the first die, the thermally conductive material defining an opening in the thermally conductive material, and wherein a dielectric material is located in the opening, the dielectric material defining a hole in the dielectric material, the hole including an electrically conductive material; and thermally coupling a second die to the thermally conductive material located on the surface of the first die, the second die having at least one through via, the at least one through via having an electrically insulating lining, the at least one through via having an electrically conductive substance within a volume defined by the electrically insulating lining, wherein the electrically conductive material in the hole is electrically coupled to the electrically conductive substance in the through via of the first die and to the electrically conductive substance in the through via of the second die;

wherein the step of providing a first die includes:
depositing a dielectric material onto the first die;
removing the dielectric material from a portion from the first die wherein the removing leaves dielectric material that is near the at least one through via;
depositing a metal onto the first die, including on the dielectric material, the metal forming a heat spreader;
removing metal from the first die until the dielectric material is exposed;
removing a center portion of the dielectric until the electrically conductive substance within the electrically insulating lining is exposed; and
placing electrically conductive material in the hole of the dielectric material.

5. The method of manufacturing a microelectronic assembly of claim 4, wherein the step of depositing a metal onto the first die comprises depositing copper onto the first die.

6. The method of manufacturing a microelectronic assembly of claim 5, wherein the step of removing metal includes removing the copper by one of polishing, etchback, and chemical mechanical planarization.

7. A method of manufacturing a microelectronic assembly, comprising:
providing a heat spreader having a first major surface of a layer of electrically conductive material and a second major surface of the layer of electrically conductive material opposite the first major surface;
thermally coupling at least one die to at least a portion of the first major surface of the layer of electrically conductive material of the heat spreader;
thermally coupling at least one other die to at least a portion of the second major surface of the layer of electrically conductive material of the heat spreader, wherein the thermally coupling includes attaching the one other die with adhesive to the second major surface;
forming an opening in the layer of electrically conductive material of the heat spreader, the opening located in a region of the heat spreader between the at least one die and the at least one other die;
disposing an insulator in the opening to produce an electrically insulated through hole in the insulator; and
disposing electrically conductive material in the electrically insulated through hole in the insulator.

8. The method of manufacturing a microelectronic assembly of claim 7, wherein the at least one die and the at least one other die are electrically coupled by the electrically conductive material in the electrically insulated through hole in the insulator disposed in the opening of the heat spreader.

9. The method of manufacturing a microelectronic assembly of claim 7, wherein the heat spreader comprises an electrically conductive material.

10. The method of manufacturing a microelectronic assembly of claim 9, wherein the layer of electrically conductive material of the heat spreader and the electrically conductive material in the electrically insulated through hole in the insulator includes a same material.

11. The method of manufacturing a microelectronic assembly of claim 7, wherein the electrically conductive material in the electrically insulated through hole in the insulator is one of a conductive epoxy and a B-staged conductive polymer.

12. The method of manufacturing a microelectronic assembly of claim 7, wherein the electrically conductive material in the electrically insulated through hole is solder.

13. The method of manufacturing a microelectronic assembly of claim 7, wherein the insulator is one of silicon dioxide, silicon nitride, and a non-electrically conductive polymer.

14. The method of manufacturing a microelectronic assembly of claim 7, wherein the at least one die includes an active side that faces the first major surface, and wherein the at least one other die includes an active side that faces the second major surface.

15. The method of manufacturing a microelectronic assembly of claim 7, wherein the at least one die and the at least one other die each includes at least one through via and an electrically conductive substance therein, and wherein the electrically conductive material in the electrically insulated through hole of the heat spreader is coupled to the electrically conductive substance in the through via of the at least one die and to the electrically conductive substance in the through via of the at least one other die.

16. The method of manufacturing a microelectronic assembly of claim 15, wherein at least a portion of the through via of the at least one die, at least a portion of the electrically insulated through hole in the heat spreader, and at least a portion of the through via of the at least one other die, are aligned.

17. The method of manufacturing a microelectronic assembly of claim 7, wherein one or both of the at least one die and the at least one other die each comprises a stack of die.

* * * * *